(12) United States Patent
Wang et al.

(10) Patent No.: US 7,233,493 B2
(45) Date of Patent: Jun. 19, 2007

(54) ELECTRONIC DEVICE HAVING A TEMPERATURE CONTROL SYSTEM INCLUDING A DUCTWORK ASSEMBLY

(75) Inventors: Jian Wang, Goleta, CA (US); Gang Yu, Santa Barbara, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 304 days.

(21) Appl. No.: 10/914,871

(22) Filed: Aug. 10, 2004

(65) Prior Publication Data

US 2006/0034051 A1    Feb. 16, 2006

(51) Int. Cl.
*H05K 7/20* (2006.01)

(52) U.S. Cl. ............... 361/695; 361/692; 361/694; 313/33; 313/35; 348/748

(58) Field of Classification Search ............... 361/696, 361/688–690, 692–695; 454/184; 165/170, 165/174; 348/748; 313/33, 35; 362/218
See application file for complete search history.

(56) References Cited

U.S. PATENT DOCUMENTS

| | | | |
|---|---|---|---|
| 4,730,233 A * | 3/1988 | Osterman ............... 361/693 |
| 5,183,323 A | 2/1993 | Daniel |
| 5,207,505 A | 5/1993 | Naraki et al. |
| 5,275,237 A * | 1/1994 | Rolfson et al. ............ 165/80.5 |
| 5,508,782 A | 4/1996 | Koh et al. |
| 5,563,768 A * | 10/1996 | Perdue ............... 361/695 |
| 5,634,711 A | 6/1997 | Kennedy et al. |
| 5,831,816 A | 11/1998 | Johns et al. |
| RE36,060 E | 1/1999 | Miyashita |
| 5,907,222 A | 5/1999 | Lengyel et al. |
| 5,923,532 A * | 7/1999 | Nedved ............... 361/690 |
| 6,007,205 A | 12/1999 | Fujimori |
| 6,104,451 A | 8/2000 | Matsuoka et al. |
| H1876 H | 10/2000 | Knox et al. |
| 6,181,070 B1 | 1/2001 | Dunn et al. |
| 6,181,553 B1 | 1/2001 | Cipolla et al. |
| 6,255,786 B1 | 7/2001 | Yen |
| 6,265,820 B1 | 7/2001 | Ghosh et al. |
| 6,272,012 B1 * | 8/2001 | Medin et al. ............... 361/690 |
| 6,353,295 B1 | 3/2002 | Sridhar et al. |

(Continued)

FOREIGN PATENT DOCUMENTS

GB        514003        10/1939

*Primary Examiner*—Michael Datskovsky
*Assistant Examiner*—Robert J. Hoffberg
(74) *Attorney, Agent, or Firm*—John H. Lamming

(57) ABSTRACT

A ductwork assembly can be used with an electronic device wherein the electronic device includes a fan and the ductwork assembly is configured to receive a heat transfer fluid from the fan. A disperser lies within the ductwork assembly and is attached thereto in order to affect at least a portion of a flow of the heat transfer fluid. The ductwork assembly may also include a first channel and the first channel is characterized by a first average fluid velocity that is a highest average fluid velocity of all channels within the ductwork assembly. The ductwork assembly may include a second channel that is characterized by a second average fluid velocity that is a lowest average fluid velocity of all channels within the ductwork assembly. The second averaged fluid velocity may be no less than 90% of the first averaged fluid velocity.

2 Claims, 10 Drawing Sheets

U.S. PATENT DOCUMENTS

| | | |
|---|---|---|
| 6,417,832 B1 | 7/2002 | Skinner et al. |
| 6,466,440 B2 * | 10/2002 | Kaneko .................... 361/690 |
| 6,469,449 B1 | 10/2002 | Leung et al. |
| 6,476,560 B2 | 11/2002 | Terami et al. |
| 6,575,599 B1 | 6/2003 | Imamura et al. |
| 6,671,177 B1 | 12/2003 | Han |
| 6,693,381 B2 | 2/2004 | Bell et al. |
| 2003/0147036 A1 | 8/2003 | Kaise et al. |
| 2004/0135482 A1 * | 7/2004 | Thielemans et al. .......... 313/22 |
| 2005/0134526 A1 * | 6/2005 | Willem et al. ............... 345/1.3 |

\* cited by examiner

ELECTRONIC DEVICE HAVING A TEMPERATURE CONTROL SYSTEM INCLUDING A DUCTWORK ASSEMBLY

FIELD OF THE INVENTION

The invention relates in general to electronic devices, and more particularly to electronic devices having temperature control systems including ductwork assemblies.

BACKGROUND INFORMATION

Electronic devices, including organic electronic devices, continue to be used more extensively in everyday life. Examples of organic electronic devices include Organic Light-Emitting Diode ("OLED") displays. The radiation emission efficiencies of OLEDs are typically in a range of approximately one to twenty candelas per ampere (1–20 cd/A). For a full-color display with a fifty percent (50%) aperture ratio and with a circular polarizer with approximately forty percent (40%) optical transmission, the current density is in a range of approximately thirty to six hundred milliamperes per square centimeters (30–600 mA/cm$^2$) for an emission intensity of approximately 400 cd/m$^2$. At an operation voltage of approximately five volts (5 V), the corresponding input electric power density is in a range of approximately 0.15–3.0 watts per square centimeter (W/cm$^2$). Aside from the conversion into energy for radiation emission, much of the input electrical energy is converted into heat. When thermal conduction from the emission layer to the surroundings is not sufficient, substantial panel heating will occur.

A conventional active matrix ("AM") driven device includes a common cathode. This common electrode layer can be subjected to high current density when the display size is large or when the emission intensity increases above certain levels. In such cases, if the heat flowing from the radiation-emitting region to the ambient air is insufficient, a significant temperature rise will also take place in the device. In particular, the operation lifetime of OLEDs is dependent on operation temperatures. For example, for devices with emissive layers using poly(phenylenevinylene) (PPV) derivatives with yellow or orange colors, the operation lifetime can be approximately 35 times shorter at 80° C. than at 25° C. Other electronic devices may experience reduced lifetimes due to higher operating temperature.

In a conventional OLED, the common cathode can be covered by an epoxy layer and glass sheet. Another conventional OLED can be covered by a metal cap that has a desiccant. The metal cap is attached using an adhesive. These OLEDs may have thermal resistance coefficients that are typically greater than 150° C.·cm$^2$/W. The corresponding temperature rise of the radiation-emitting electronic components could be higher than 10° C. when operating at 200 cd/m$^2$ for a display having an area of approximately 3–6 cm$^2$. Outdoor display applications and lighting panels can have emission intensities of 500–2000 cd/m$^2$ and 2000–5000 cd/m$^2$, respectively. AM-driven OLED displays in such applications may not be stably operated at such high brightness levels, and the temperature may not even be stabilized due to insufficient heat flow out of the device (a phenomenon known as thermal run-off).

Heat dissipation issues are not unique to organic electronic devices. Inorganic (e.g., silicon-based) integrated circuits ("ICs") can generate significant amounts of heat. Most notable are microprocessors (e.g., Intel Pentium™, AMD Athlon™, IBM PowerPC™ processors) due to their power requirements.

SUMMARY OF THE INVENTION

In one embodiment, an electronic device includes a fan and a ductwork assembly that is configured to receive a heat transfer fluid from the fan. The electronic device also includes a disperser that lies within the ductwork assembly and is attached to the ductwork assembly in order to affect at least a portion of a flow of the heat transfer fluid within the ductwork assembly.

In another embodiment, a ductwork assembly is provided for an electronic device. The ductwork assembly includes a first channel. The first channel is characterized by a first averaged fluid velocity that is a highest averaged fluid velocity of all channels within the ductwork assembly. The ductwork assembly includes a second channel. The second channel is characterized by a second averaged fluid velocity that is a lowest averaged fluid velocity of all channels within the ductwork assembly. In a particular embodiment, the second averaged fluid velocity is no less than 90% of the first averaged fluid velocity.

In yet another embodiment, a ductwork assembly for an electronic device is provided. The ductwork assembly includes a first channel that includes an inlet end and an outlet end. A geometry of the first channel at a point closer to the inlet end is larger than a geometry of the first channel at a point closer to the outlet end.

In still another embodiment, an electronic device includes a ductwork assembly. The ductwork assembly is configured to allow a geometry of a first channel within the ductwork assembly to be changed while (1) a heat transfer fluid is flowing through the first channel, (2) the electronic device is operating, or (3) a combination thereof.

In yet still another embodiment, a ductwork assembly for an electronic device includes a serpentine channel. The serpentine channel is thermally coupled to a targeted area of the electronic device.

In another embodiment, an electronic device includes a targeted area and an expansion valve that is adjacent to the targeted area. The electronic device also includes a pressurized fluid. A portion of the pressurized fluid flows through the expansion valve to form a decompressed fluid that flows at least partially across the targeted area.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
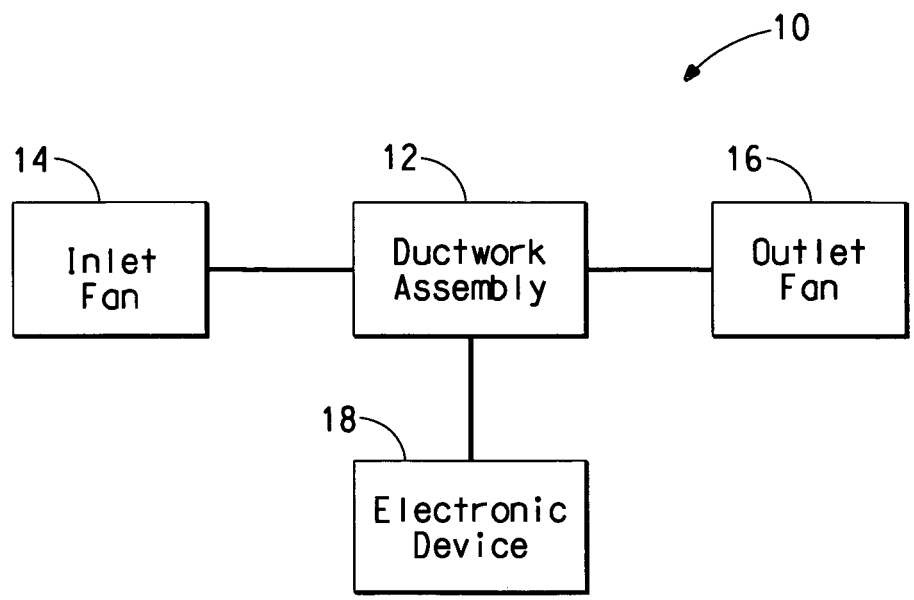
FIG. 1 is a block diagram of a first embodiment of an electronic device temperature control system.

Skilled artisans appreciate that features in the figures are illustrated for simplicity and clarity and have not necessarily been drawn to scale. For example, the dimensions of some of the features in the figures may be exaggerated relative to other features to help to improve understanding of embodiments of the invention.

DETAILED DESCRIPTION

In one embodiment, an electronic device includes a fan and a ductwork assembly that is configured to receive a heat transfer fluid from the fan. The electronic device also includes a disperser that lies within the ductwork assembly and is attached to the ductwork assembly in order to affect at least a portion of a flow of the heat transfer fluid within the ductwork assembly.

In a particular embodiment, the disperser is a deflector. The deflector can be substantially planar or at least a portion of the deflector near a center of a deflection side of the deflector can be curved. The disperser can also be a flow distributor.

In an illustrative embodiment, the electronic device further comprises an array of electronic components. The array has a surface with a targeted area, and the ductwork assembly is configured to route the heat transfer fluid near the targeted area.

In another embodiment, a ductwork assembly is provided for an electronic device. The ductwork assembly includes a first channel. The first channel is characterized by a first averaged fluid velocity that is a highest averaged fluid velocity of all channels within the ductwork assembly. Moreover, the ductwork assembly includes a second channel. The second channel is characterized by a second averaged fluid velocity that is a lowest averaged fluid velocity of all channels within the ductwork assembly. In a particular embodiment, the second averaged fluid velocity is no less than 90% of the first averaged fluid velocity.

In a particular embodiment, the first channel includes an inlet end and an outlet end. A geometry of the first channel at a point closer to the inlet end is larger than a geometry of the first channel at a point closer to the outlet end. In another particular embodiment, the ductwork assembly can include a manifold that is fluidly connected to the first channel and the second channel. The manifold has a first geometry and a second geometry. The first geometry lies immediately adjacent to the first channel, and the second geometry lies immediately adjacent to the second channel. Moreover, the first geometry is larger than the second geometry.

In an illustrative embodiment, an electronic device can include the ductwork assembly. Further, the ductwork assembly can be configured to allow a geometry of at least one channel within the ductwork assembly to be changed while (1) a heat transfer fluid is flowing through the at least one channel, (2) the electronic device is operating, or (3) a combination thereof.

In yet another embodiment, a ductwork assembly for an electronic device is provided. The ductwork assembly includes a first channel. The first channel includes an inlet end and an outlet end. Additionally, a geometry of the first channel at a point closer to the inlet end is larger than a geometry of the first channel at a point closer to the outlet end.

In a particular embodiment, the ductwork assembly can further include a second channel and the geometry of the first channel at the point closer to the outlet end of the first channel is less than a geometry at any point within the second channel. In another particular embodiment, the first channel can be characterized by a first averaged fluid velocity that is a highest averaged fluid velocity of all channels within the ductwork assembly and the second channel can be characterized by a second averaged fluid velocity that is a lowest averaged fluid velocity of all channels within the ductwork assembly. In a particular embodiment, the second averaged fluid velocity is no less than 90% of the first averaged fluid velocity.

In still another embodiment, an electronic device includes the ductwork assembly. The ductwork assembly can be configured to allow a geometry of a first channel within the ductwork assembly to be changed while (1) a heat transfer fluid is flowing through the first channel, (2) the electronic device is operating, or (3) a combination thereof. In still another embodiment, the ductwork assembly is further configured to allow a geometry of a second channel within the ductwork assembly to be changed while (1) a heat transfer fluid is flowing through the second channel, (2) the electronic device is operating, or (3) a combination thereof.

In a particular embodiment, the ductwork assembly is configured so that the geometry of the first channel can be changed independently of the geometry of the second channel. Alternatively, the ductwork assembly is configured so that the geometry of the first channel cannot be changed independently of the geometry of the second channel. In still another embodiment, the first channel is characterized by a first averaged fluid velocity that is a highest averaged fluid velocity of all channels within the ductwork assembly and the second channel is characterized by a second averaged fluid velocity that is a lowest averaged fluid velocity of all channels within the ductwork assembly. Further, the second averaged fluid velocity is no less than 90% of the first averaged fluid velocity.

In yet still another embodiment, a ductwork assembly for an electronic device includes a serpentine channel. The serpentine channel is thermally coupled to a targeted area of the electronic device. In a particular embodiment, the ductwork assembly comprises an inlet end and an outlet end and the serpentine channel is fluidly connected between the inlet end and the outlet end.

Each of the above embodiments may include a fan that is located near the inlet end of the ductwork assembly, the outlet end of the ductwork assembly, or a combination thereof. Moreover, each of the above embodiments may further include an array of organic electronic components comprising an organic active layer.

In another embodiment, an electronic device includes a targeted area and an expansion valve that is adjacent to the targeted area. The electronic device also includes a pressurized fluid. A portion of the pressurized fluid flows through the expansion valve to form a decompressed fluid that flows at least partially across the targeted area.

In a particular embodiment, the electronic device further includes a ductwork assembly that is fluidly connected to the expansion valve and that is thermally coupled to at least a portion of the targeted area of the electronic device. Also, in a particular embodiment, the electronic device includes a pressurized tank that is fluidly connected to the expansion valve. In another particular embodiment, the electronic device includes a reservoir and the reservoir collects the decompressed fluid after it flows across the targeted area. In yet another particular embodiment, the electronic device includes a compressor that is fluidly connected to the ductwork assembly. The compressor is part of a recirculation loop.

The detailed description first addresses Definitions and Clarification of Terms followed by Structures, Materials, and Configurations; Temperature Control Systems Including Ductwork Assemblies; Positional Relationships Between Ductwork Assemblies and Electronic Devices; Ductwork Assemblies; Other Embodiments; and finally, Advantages.

1. Definitions and Clarification of Terms

Before addressing details of embodiments described below, some terms are defined or clarified. As used herein, the term "active" when referring to a layer or material is intended to mean a layer or material that has electronic or electro-radiative properties. An active layer material may emit radiation or exhibit a change in concentration of electron-hole pairs when receiving radiation.

The terms "array," "peripheral circuitry," and "remote circuitry" are intended to mean different areas or components of an electronic device. For example, an array may include a number of pixels, cells, or other structures within an orderly arrangement (usually designated by columns and rows). The pixels, cells, or other structures within the array may be controlled locally by peripheral circuitry, which may lie on the same substrate as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "averaged," when referring to a value, is intended to mean an intermediate value between a high value and a low value. For example, an averaged value can be an average, a geometric mean, or a median.

The term "averaged fluid velocity" is intended to mean a velocity representative of the speed at which a fluid is moving. The averaged fluid velocity can be based on a single measurement or an averaged value using a plurality of measurements.

The term "channel," is intended to mean a passage for a heat transfer fluid.

The terms "cross-sectional area," when referring to a channel or manifold of a ductwork assembly, is an area of the channel substantially perpendicular to the principal fluid flow through the channel or manifold.

The term "deflector" in intended to mean a structure that is configured to change the principal direction of at least a portion of a fluid flow.

The term "deflector side" is intended to mean a side of a deflector, wherein such side causes the principal direction of at least a portion of a fluid flow to be changed.

The terms "diameter," "height," and "width," when referring to a channel or manifold of a ductwork assembly, are intended to mean dimensions substantially perpendicular to the principal fluid flow through the channel or manifold. A channel or manifold may have dimensions that include one or more of the diameter, height, and width.

The term "disperser" is intended to mean an object that affects at least a portion of a fluid flow.

The terms "ductwork assembly" is intended to mean a set of at least two channels used in routing a heat transfer fluid to or near a targeted area. The ductwork assembly may or may not include one or more manifolds.

The term "electronic component" is intended to mean a lowest level unit of a circuit that performs an electrical function. An electronic component may include a transistor, a diode, a resistor, a capacitor, an inductor, or the like. An electronic component does not include parasitic resistance (e.g., resistance of a wire) or parasitic capacitance (e.g., capacitive coupling between two conductors connected to different electronic components where a capacitor between the conductors is unintended or incidental).

The term "electronic device" is intended to mean a collection of circuits, electronic components, or combinations thereof that collectively, when properly connected and supplied with the proper potential(s), performs a function. An electronic device may include or be part of a system. Examples of electronic devices include displays, sensor arrays, computer systems, avionics, automobiles, cellular phones, and many other consumer and industrial electronic products.

The term "fan" is intended to mean a device having at least one moving part for creating or assisting a flow of a fluid. Fan should be broadly construed to include a muffin fan, a pump, and the like.

The term "flow distributor" is intended to mean a structure having a surface, which from a plan view of a ductwork assembly, helps to redirect a flow of a fluid more uniformly across the targeted area. Examples of flow distributors include baffle plates, orifice plates, conical structures, and the like.

The term "fluid" is intended to mean a liquid, a gas, a supercritical fluid, or any combination thereof. A fluid may include one material or a combination of materials.

The term "fluidly connected" is intended to mean that at least two structures, or portions of a structure, or combinations thereof that are connected such that a fluid can pass from one structure or a portion thereof to the other structure(s) or portion(s) thereof.

The term "geometry," when referring to a channel or manifold within a ductwork assembly, is intended to mean a dimension or an area of the channel or manifold, where such dimension or area is substantially perpendicular to the principal flow of fluid through the channel or manifold. Width, height, diameter, and cross-sectional area, but not length, are examples of geometries.

The term "heat transfer fluid" is intended to mean a fluid that is used to heat an object, cool the object, maintain the object at a substantially constant temperature or within a desired temperature range, or any combination thereof.

The term "inlet," when used as an adjective, is intended to modify an object (e.g. a fan, an end of a channel, a manifold, etc.) to refer to a point, area, or region adjacent to where a fluid (1) enters a structure (e.g., a channel, a manifold, ductwork assembly, etc.), (2) moves closer to a center of a targeted area, or (3) a combination thereof.

The term "length," when referring to a channel of a ductwork assembly, is intended to mean a dimension substantially parallel to the principal fluid flow through the channel.

The term "manifold" is intended to mean a portion of a ductwork assembly fluidly coupled to at least two different channels within the ductwork assembly. An inlet manifold and an outlet manifold are examples of manifolds.

The term "organic electronic device" is intended to mean a device including one or more organic semiconductor layers or materials. Organic electronic devices include: (1) devices that convert electrical energy into radiation (e.g., a light-emitting diode, light-emitting diode display, diode laser, or lighting panel), (2) devices that detect signals through electronic processes (e.g., photodetectors (e.g., photoconductive cells, photoresistors, photoswitches, phototransistors, phototubes), infrared ("IR") detectors, biosensors), (3) devices that convert radiation into electrical energy (e.g., a photovoltaic device or solar cell), and (4) devices that include one or more electronic components that include one or more organic semiconductor layers (e.g., a transistor or diode).

The term "outlet," when used as an adjective, is intended to modify an object (e.g. a fan, an end of a channel, a manifold, etc.) to refer to a point, area, or region adjacent to where a fluid (1) leaves a structure (e.g., a channel, a manifold, ductwork assembly, etc.), (2) moves further from a center of a targeted area, or (3) a combination thereof.

The term "serpentine channel" is intended to mean a channel that winds around between an inlet end of the channel and an outlet end of the channel. In one embodiment, a serpentine channel comprises two adjacent portions, wherein the principal directions of flows within the two portions are substantially opposite each other.

The term "targeted area" is intended to mean an area that is intended to be cooled, heated, maintained at a substantially constant temperature, or any combination of thereof.

The term "thermally coupled" is intended to mean at least two of any layers, materials, members or structures have contact with each other or, if there are any intervening layer(s) material(s), member(s) or structure(s), all of such intervening layer(s), material(s), member(s) or structure(s) have low thermal resistance.

As used herein, the terms "comprises," "comprising," "includes," "including," "has," "having" or any other variation thereof, are intended to cover a non-exclusive inclusion. For example, a process, article, or apparatus that comprises a list of features is not necessarily limited only those features but may include other features not expressly listed or inherent to such process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductor arts.

2. Structures, Materials, and Configurations

Electronic devices, including organic electronic devices, can generate significant amounts of heat during operation. By improving the heat dissipation of the electronic device, the electronic device can operate under a wide variety of operating conditions without more than a 10° C. rise in temperature compared to the ambient temperature. The temperature can be measured at an external surface of the electronic device. For example, the temperature may be measured at the user side of a substrate from which a display has been fabricated. An IR measuring instrument can measure the temperature of a display or lighting panel. The IR measuring instrument may include one or more filters so that visible light from a display or a lighting panel does not significantly interfere with the temperature measurements. Alternatively, no visible light filter may be used with the IR measuring instrument. A first temperature of the substrate along the user side (the side in contact with the air) of the organic electronic device can be measured after the device has been operating for at least a minute. A second temperature of the substrate along the user side is measured after the device has been turned off (not emitting radiation or light) for at least 15 minutes. The difference between the first and second temperatures may be no more than 10° C.

The mechanism for heat dissipation may be any one or more of thermal conduction, convection, and radiation. Thermal conduction and radiation are addressed in U.S. patent application Ser. No. 10/683,828 filed on Oct. 10, 2003 (Yu et al.).

Improved heat transfer may be achieved by using a temperature control system in which a component of the temperature control system is thermally coupled to a targeted area of an electronic device (e.g., a common electrode used in organic electronic components). The temperature control system can include a fan, a ductwork assembly, or a combination of the two, thermally coupled to a targeted area within the electronic device that is to be cooled to a particular temperature, maintained at a particular temperature, or within a desired temperature range, or any combination thereof using a heat transfer fluid at or near a targeted area of the electronic device. In one embodiment, the heat transfer fluid is thermally coupled to a common electrode for an organic electronic device. In another embodiment of the temperature control system, one or more fans can force a heat transfer fluid, such as air, through a ductwork assembly to remove heat generated by the electronic device. Also, the temperature control system can include a pressurized tank of a heat transfer fluid and a ductwork assembly.

The heat transfer fluid may be a liquid or a compressed gas within the pressurized tank and can be fed to the ductwork assembly, via a valve, to remove heat generated by the electronic device. Additionally, the temperature control system can be a closed loop system in which a heat transfer fluid, e.g., a refrigerant, is circulated therethrough. The temperature control system can include a ductwork assembly that is thermally coupled to the electronic device. In this embodiment, the ductwork assembly acts as an evaporator and the working fluid can be used to remove heat from the electronic device. In still another embodiment, a ductwork assembly is not required. For example, a pressurized tank may include air, nitrogen, carbon dioxide, a noble gas (e.g., helium, neon, argon, krypton xenon, radon) or other relatively inert gas that can cool the targeted area as it expands.

3. Temperature Control Systems Including Ductwork Assemblies

Attention is now directed to some exemplary, non-limiting configurations of temperature control systems including ductwork assemblies that can be used to keep an electronic device from overheating during operation.

Referring initially to FIG. 1, a first embodiment of a temperature control system for an electronic device is depicted and is generally designated 10. As depicted in FIG. 1, the temperature control system includes a ductwork assembly 12 to which an inlet fan 14 can be fluidly connected, e.g., to an inlet end established by the ductwork assembly 12. The ductwork assembly 12 can be any of the ductwork assemblies described in conjunction with FIG. 4 through FIG. 18. Note that temperature control systems including ductwork assemblies are not limited only to those illustrated in FIG. 4 through FIG. 18. After reading this specification, skilled artisans will be able to apply other temperature control systems with ductwork assemblies that fit their particular needs or desires.

FIG. 1 further illustrates that an outlet fan 16 can also be fluidly connected to the ductwork assembly 12, e.g., to an outlet end established by the ductwork assembly 12. Moreover, as illustrated, the ductwork assembly 12 can be thermally coupled to an electronic device 18. In one embodiment, the electronic device 18 includes an organic radiation-emitting electronic component, but it can be appreciated that the electronic device 18 can be an integrated circuit ("IC") including inorganic electronic components, or nearly any other electronic device. It can be appreciated that system 10 depicted in FIG. 1 can include only the inlet fan 14, only the outlet fan 16, or both the inlet fan 14 and the outlet fan 16, as illustrated. In one embodiment, only one of the inlet fan 14 or outlet fan 16 may be used. In another embodiment, more than one inlet fan 14, more than one outlet fan 16, or more than one inlet fan 14 and more than one outlet fan 16 may be used.

Accordingly, in the embodiment as illustrated in FIG. 1, a heat transfer fluid, e.g., ambient air, chilled air, etc., can be forcibly provided to the ductwork assembly 12, e.g., by the inlet fan 14, by the outlet fan 16, or by both the inlet fan 14 and the outlet fan 16. Moreover, since the ductwork assembly 12 is thermally coupled to the electronic device 18, the heat transfer fluid can absorb heat generated by the electronic device 18 as the heat transfer fluid flows through the ductwork assembly 12. As such, the temperature of the electronic device 18 can be maintained at or below a desired threshold, within a desired temperature range, or any combination thereof.

Figure 2:
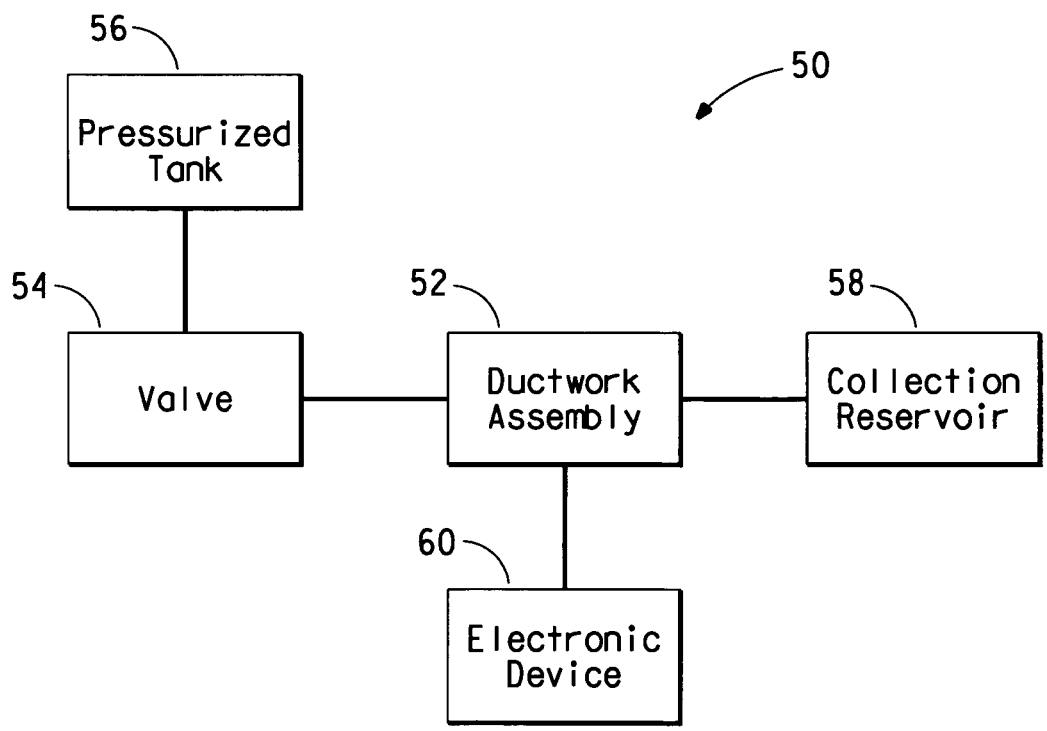
FIG. 2 is a block diagram of a second embodiment of an electronic device temperature control system.

FIG. 2 depicts a second embodiment of a temperature control system, generally designated 50. As depicted in FIG. 2, the temperature control system 50 includes a ductwork assembly 52, e.g., one or more of the ductwork assemblies described in detail below. A valve 54 is fluidly connected to the ductwork assembly 52, e.g., to an inlet end established by the ductwork assembly 52. In one embodiment, the valve 54 is a regulator valve. In turn, a pressurized tank 56 is fluidly connected to the valve 54. The pressurized tank 56 can include a heat transfer fluid as a liquid, a compressed gas, or a supercritical fluid. In one embodiment, the heat transfer fluid within the pressurized tank 56 can be nitrogen, carbon dioxide, a noble gas (e.g., helium, neon, argon, krypton xenon, radon), other relatively inert gas, or any combination thereof and can be stored in the pressurized tank 56. FIG. 2 further illustrates a collection reservoir 58 that can be fluidly connected to the ductwork assembly 52, e.g., to an outlet end established by the ductwork assembly 52. The collection reservoir 58 can be provided to collect any heat transfer fluid that exits the ductwork assembly 52 that may be dangerous to the environment. In another embodiment, the collection reservoir 58 is not used and the heat transfer fluid is allowed to enter the atmosphere. As further illustrated in FIG. 2, an electronic device 60 can be thermally coupled to the ductwork assembly 52.

In one embodiment, the valve 54 controls the flow of the heat transfer fluid from the pressurized tank 56. The valve 54 reduces the pressure of the heat transfer fluid. If the heat transfer fluid is a liquid, it may be converted to a gas. If the heat transfer fluid is a compressed gas, the valve 54 reduces the pressure of the gas. Whether by a phase change, pressure change or both, the temperature of the heat transfer fluid decreases. The cooled heat transfer fluid is allowed to flow through the ductwork assembly 52 and as it does so, it carries away heat generated by the electronic device 60 and reduces the temperature of the electronic device 60. As such, the temperature of the electronic device 60 can be maintained at or below a desired threshold, within a desired temperature range, or any combination thereof.

Figure 3:
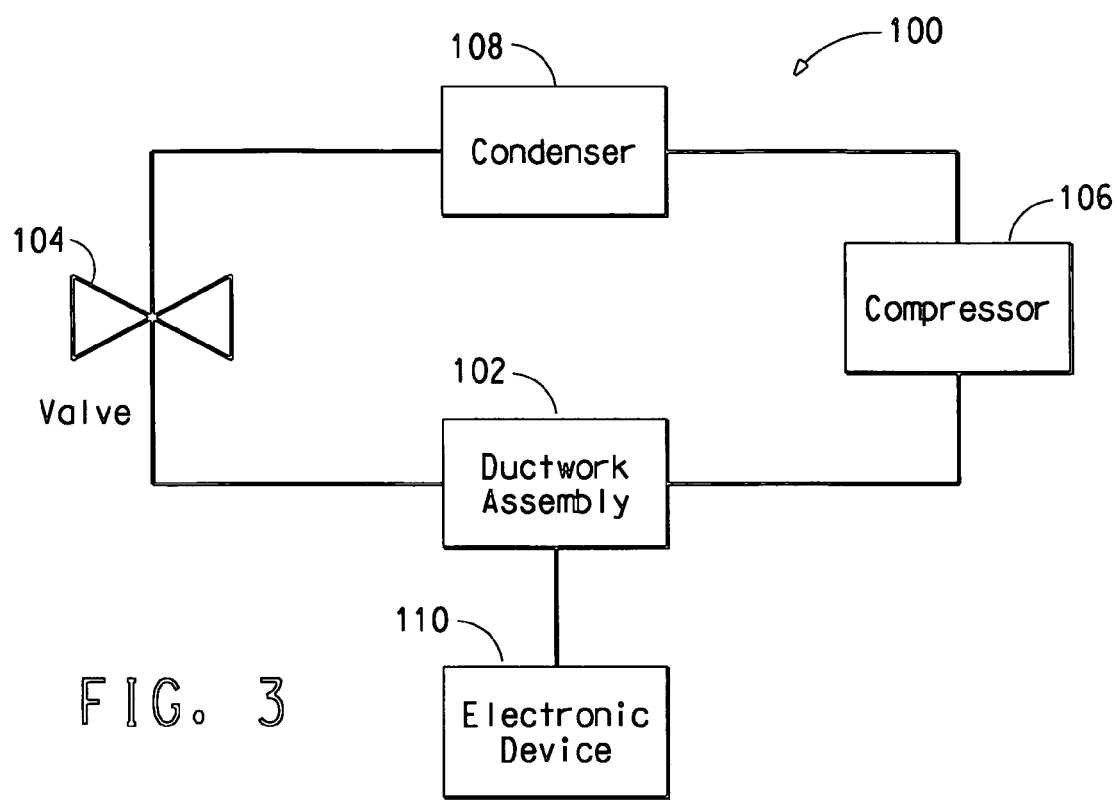
FIG. 3 is a block diagram of a third embodiment of an electronic device temperature control system.

Referring now to FIG. 3, a third embodiment of a temperature control system is portrayed and is generally designated 100. As depicted in FIG. 3, the system includes a ductwork assembly 102 to which a valve 104, such as an expansion valve, is fluidly connected, e.g., to an inlet end established by the ductwork assembly 102. A compressor 106 is fluidly connected to the ductwork assembly 102, e.g., to an outlet end formed by the ductwork assembly 102. Further, the valve 104 is fluidly connected to the compressor 106 via a condenser 108. Thus, a closed loop is established by the valve 104, the ductwork assembly 102, the compressor 106, and the condenser 108. FIG. 3 also illustrates an electronic device 110 that is thermally coupled to the ductwork assembly 102. As described below, the electronic device 110 can be cooled by the ductwork assembly 102.

In one embodiment, the closed loop, established by the valve 104, the ductwork assembly 102, the compressor 106, and the condenser 108, can include a heat transfer fluid, such as R-11, R-12, R-22, R-23, R-113, R-114, R-116, R-134a, R404A, R406A, R407C, R408A, R-409A, R-410A, R-500, R-502, R-503, $NH_3$, etc., or other refrigerants well known to those skilled in the art. Due to environmental concerns, the heat transfer fluid can include one or more non-ozone depleting refrigerants.

In one embodiment, the heat transfer fluid enters the compressor 106 as a saturated vapor at low pressure and undergoes a reversible adiabatic compression. Heat is then rejected at constant pressure within the condenser 108 and the heat transfer fluid leaves the condenser 108 as a saturated liquid. An adiabatic throttling process occurs across the valve 104 and the heat transfer fluid is then evaporated at constant pressure within the ductwork assembly 102, which acts as an evaporator. Accordingly, the heat transfer fluid is cooled during the expansion process as it flows through the ductwork assembly 102 and can remove heat from the electronic device 110 that is thermally coupled to the ductwork assembly 102. As such, the temperature of the electronic device 110 can be maintained at or below a desired threshold, within a desired temperature range, or any combination thereof.

4. Positional Relationships Between Ductwork Assemblies and Electronic Devices Directing attention now to FIG. 4 through FIG. 6, two exemplary display devices are shown to illustrate the positional relationships of a display panel and a ductwork assembly.

Figure 4:
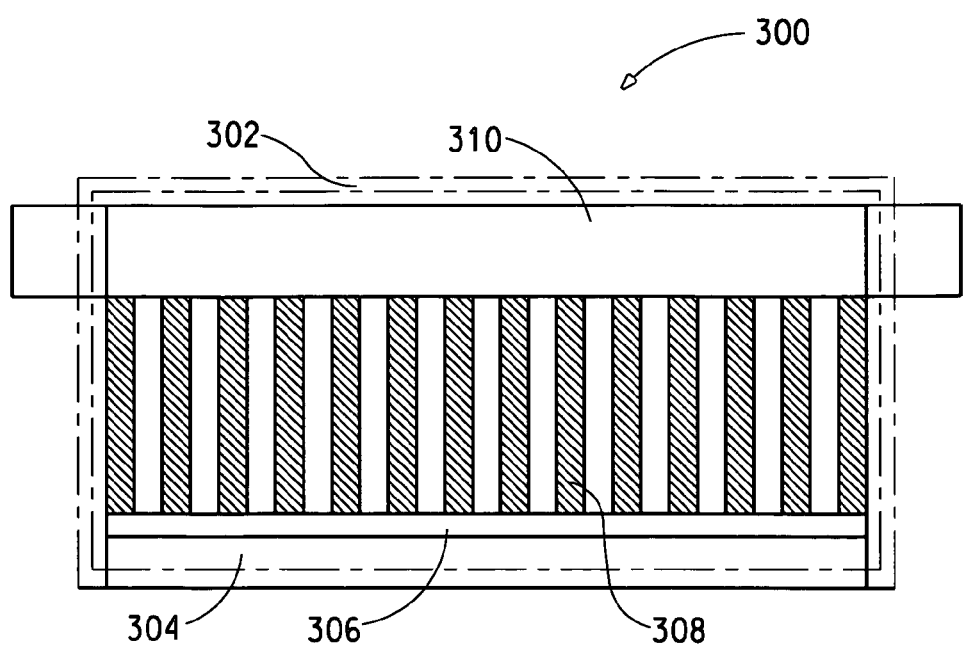
FIG. 4 is a top plan view of a first embodiment of a display device.

Referring to FIG. 4, a first embodiment of a display device is depicted and is generally designated 300. As depicted, the display device 300 includes a display enclosure 302, shown in phantom, in which a display panel 304 is disposed. The display panel 304 includes a common electrode 306 that is made, e.g., from aluminum. A heat sink 308 is disposed within the display enclosure 302 adjacent to the common electrode 306 of the display panel 304. The heat sink 308 is thermally coupled to the common electrode 306. Further, the heat sink 308 can contact all or a portion of a surface of the common electrode 306. FIG. 4 also portrays a ductwork assembly 310 that is disposed within the display enclosure 302 adjacent to the heat sink 308. The ductwork assembly 310 is thermally coupled to the heat sink 308, and a heat transfer fluid can be provided to the ductwork assembly 310 in order to carry away heat transferred to the heat sink by the display panel 304, e.g., via the common electrode 306. Thus, the ductwork assembly 310 is provided to maintain an operating temperature of the display panel 304 within an optimal range.

Figure 5:
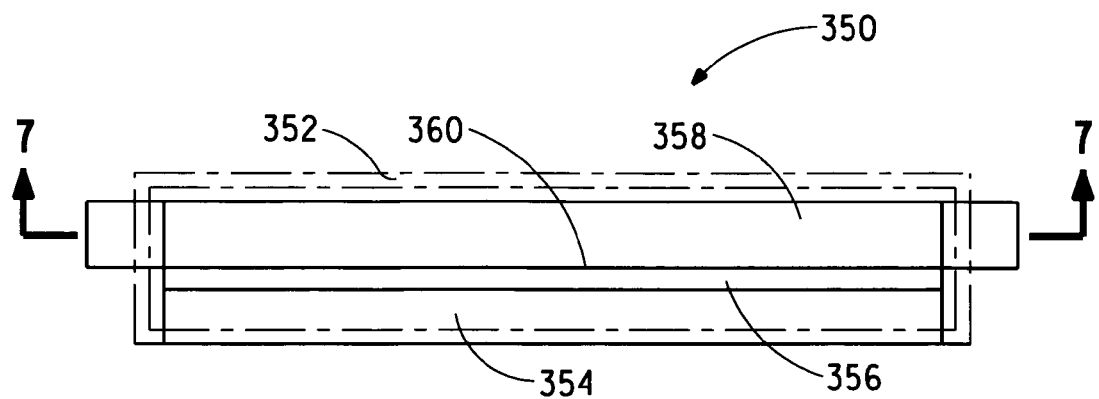
FIG. 5 is a top plan view of a second embodiment of a display device.
Figure 6:
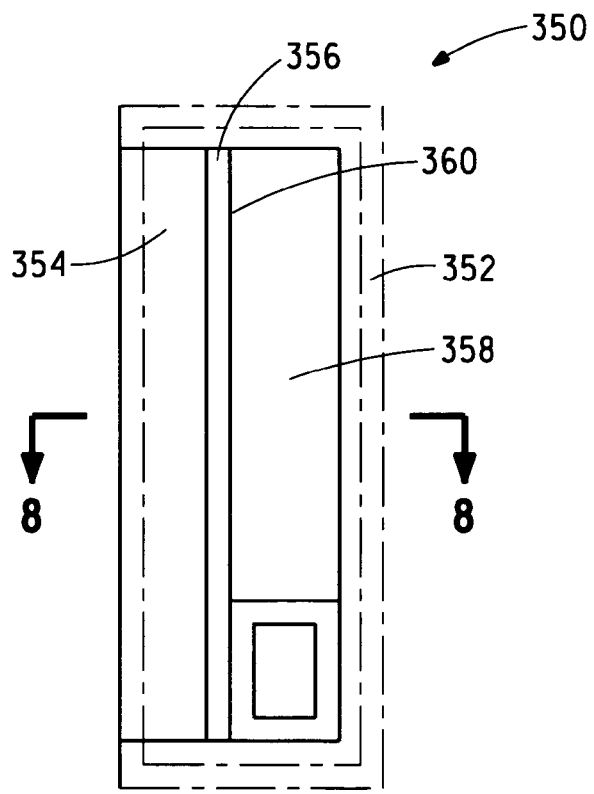
FIG. 6 is a side plan view of the second embodiment of a display device.

FIGS. 5 and 6 portray a second embodiment of a display device, generally designated 350. As illustrated in FIGS. 5 and 6, the display device 350 includes a display enclosure 352, shown in phantom, in which a display panel 354 is disposed. FIGS. 5 and 6 also depict a common electrode 356 on the display panel 354. A ductwork assembly 358 is directly adjacent to the common electrode 356 of the display panel 354. Specifically, the ductwork assembly 358 is adjacent to a targeted area 360 of the common electrode 356. The ductwork assembly 356 is thermally coupled to the common electrode 356, e.g., the targeted area 360 of the common electrode 356. Further, the ductwork assembly 356 can contact all or a portion of a surface of the common electrode 356. Moreover, a heat transfer fluid can be provided to the ductwork assembly 358 in order to carry away heat transferred to the common electrode 356 by the display panel 354. Thus, the ductwork assembly 358 can help maintain the operating temperature of the display panel 354 within an optimal range.

In a particular embodiment, the targeted area 360 is the entire display device 350, a portion of the display device 350 within the display enclosure 352, the common electrode 356, a portion of the common electrode 356, or any combination thereof.

5. Ductwork Assemblies

Referring now to FIG. 7 through FIG. 18, several embodiments of ductwork assemblies are shown. In a particular embodiment, each ductwork assembly can be made from one or any combination of metals, metal alloys, glass, ceramics, plastics, etc.

Figure 7:
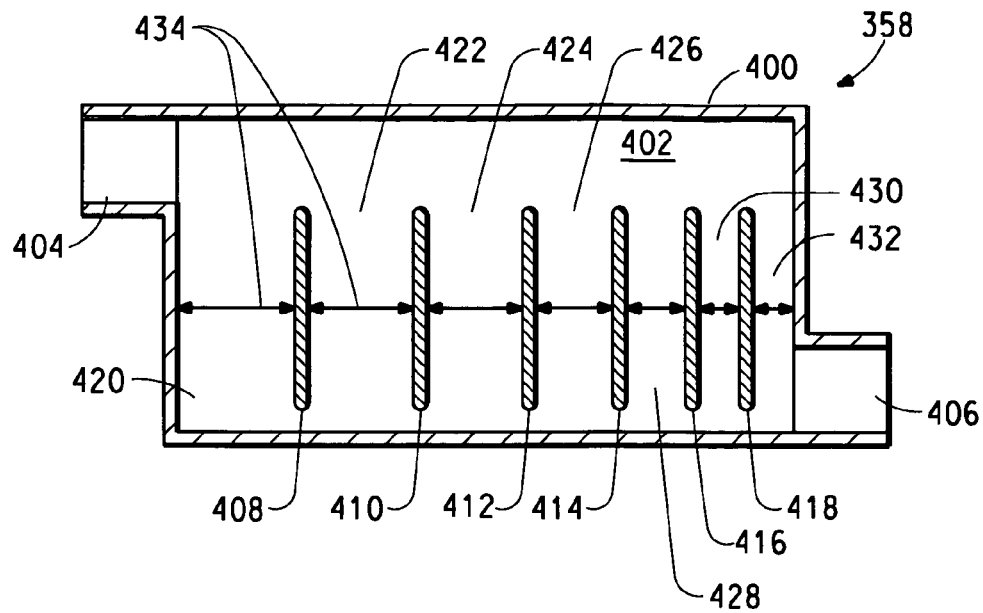
FIG. 7 is a cross-sectional view of a first embodiment of a ductwork assembly taken along line 7—7 in FIG. 5.

FIG. 7 portrays a cross-sectional view of a first embodiment of a ductwork assembly, e.g., the ductwork assembly 358 depicted in FIG. 5. As illustrated in FIG. 7, the ductwork assembly 358 includes a housing 400. Within the housing 400, an interior cavity 402 is formed. An inlet end 404 leads to the interior cavity 402 of the housing 400. Moreover, an outlet end 406 leads from the interior cavity 402 of the housing 400. FIG. 7 further depicts a first channel divider 408, a second channel divider 410, a third channel divider 412, a fourth channel divider 414, a fifth channel divider 416, and a sixth channel divider 418. The channel dividers 408, 410, 412, 414, 416, 418 extend from a back wall of the housing to a front wall of the housing and are oriented to establish a first channel 420, a second channel 422, a third channel 424, a fourth channel 426, a fifth channel 428, a sixth channel 430, and a seventh channel 432 within the interior cavity 402 of the housing. As portrayed in FIG. 7, the channel dividers 408, 410, 412, 414, 416, 418 are substantially parallel to each other and as such, the channels 420, 422, 424, 426, 428, 430, 432 are substantially parallel to each other.

As illustrated in FIG. 7, each channel 420, 422, 424, 426, 428, 430, 432 can have a different width 434. In one embodiment, from the first channel 420 to the seventh channel 432, the channels get progressively narrower. In other words, the second channel 422 is narrower than the first channel 420, the third channel 424 is narrower than the second channel 422, the fourth channel 426 is narrower than the third channel, the fifth channel 428 is narrower than the fourth channel 426, the sixth channel 430 is narrower than the fifth channel 428, and the seventh channel 432 is narrower than the sixth channel 430.

This arrangement, i.e., the progressive narrowing of the channels 420, 422, 424, 426, 428, 430, 432, accounts for a pressure drop occurring in the heat transfer fluid as it travels away from the inlet. In other words, the heat transfer fluid loses velocity as it travels further from the inlet. By progressively narrowing the channels 420, 422, 424, 426, 428, 430, 432, the lowest averaged fluid velocity within any of the channels 420, 422, 424, 426, 428, 430, 432 is no less than 90% of the highest averaged fluid velocity within any or all of the other channels. In a more specific embodiment, the lowest averaged fluid velocity within any of the channels 420, 422, 424, 426, 428, 430, 432 is no less than 95% of the highest averaged fluid velocity within any or all of the other channels. As such, the heat transfer fluid that flows through the ductwork assembly 358 is relatively uniformly distributed. Depending on the flow rate of the heat transfer fluid into the ductwork assembly 358, the widths of the channels 420, 422, 424, 426, 428, 430, 432 can be adjusted to maintain the averaged fluid velocities through each channel 420, 422, 424, 426, 428, 430, 432 closer to one another. In another embodiment, the design may allow for the channels to be successively wider near the outlet end 406 instead of the inlet end 404.

Figure 8:
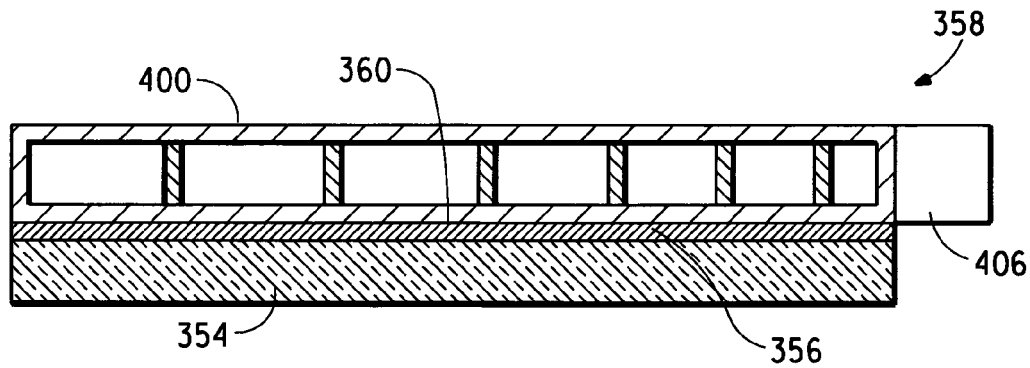
FIG. 8 is a cross-sectional view of the first embodiment of a ductwork assembly taken along line 8—8 in FIG. 6.

Referring now to FIG. 8, another cross-sectional view of the first embodiment of the ductwork assembly 358 is depicted. This cross-sectional view is provided to indicate that the housing 400 is a closed, generally boxed-shaped housing 400 and does not allow heat transfer fluid passing through the ductwork assembly 358 to contact the common electrode 356 of the display device 354. Thus, in the case of a caustic heat transfer fluid, e.g., $NH_3$, damage to the common electrode 356 can be prevented.

Figure 9:
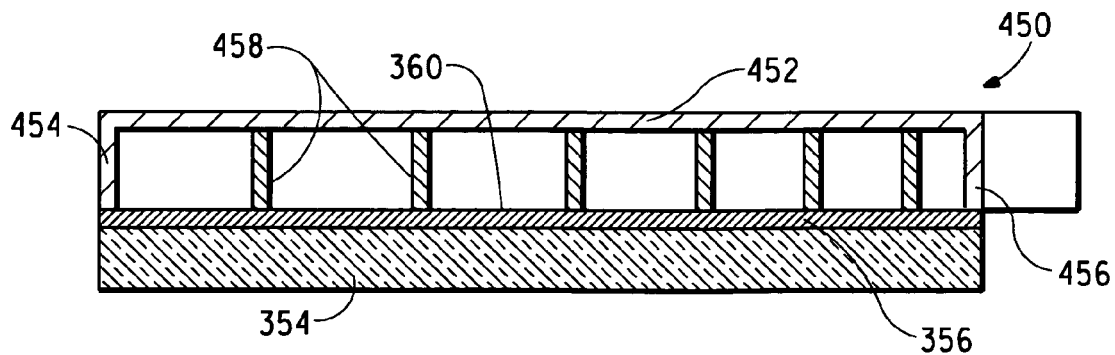
FIG. 9 is a cross-sectional view of a second alternate embodiment of a ductwork assembly.

FIG. 9 depicts a second embodiment of a ductwork assembly, designated 450. This embodiment of a ductwork assembly 450 includes a back wall 452 from which a first side wall 454 and a second side wall 456 extend. As illustrated in FIG. 9, plural channel dividers 458 extend from the back wall 452 between the first side wall 454 and the second side wall 456. The channel dividers 458 are arranged in the same manner as those described in conjunction with FIG. 7. The ductwork assembly 450 has an open front and therefore, any heat transfer fluid flowing through the ductwork assembly 450 can have direct contact with the common electrode 356 of the display device 354.

Figure 10:
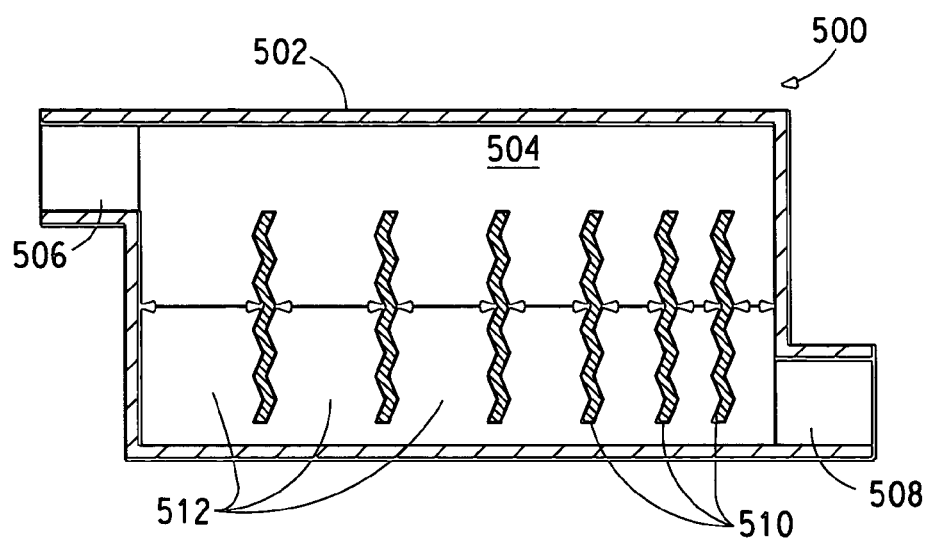
FIG. 10 is a cross-sectional view of a third embodiment of a ductwork assembly.

FIG. 10 portrays a cross-sectional view of a third embodiment of a ductwork assembly, designated 500. As illustrated in FIG. 10, the ductwork assembly 500 includes a housing 502. An interior cavity 504 is formed within the housing 502. Also, an inlet end 506 leads to the interior cavity 504 of the housing 502. An outlet end 508 leads from the interior cavity 504 of the housing 502. FIG. 10 further depicts plural corrugated channel dividers 510 that are disposed within the interior cavity 504 of the housing 502. The corrugated channel dividers 510, which in one embodiment have relatively sharp corners, establish plural channels 512 that have the same general geometrical characteristics, i.e., the progressive narrowing of the widths of the channels 420, 422, 424, 426, 428, 430, 432, described in conjunction with FIG. 7. Moreover, the corrugated channel dividers 510 promote turbulent flow through the channels 512, which, in turn, increases the heat transfer ability of the heat transfer fluid flowing through the ductwork assembly 500.

Figure 11:
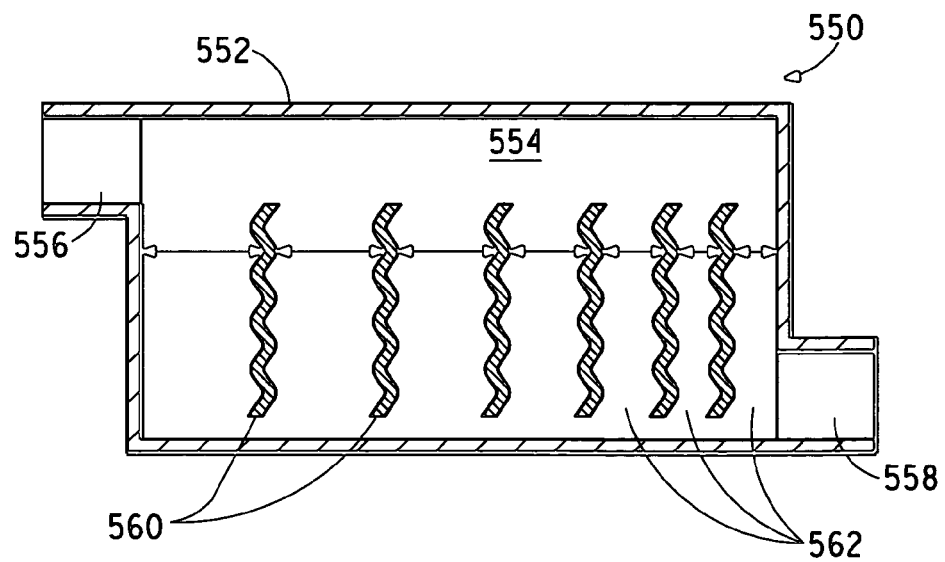
FIG. 11 is a cross-sectional view of a fourth embodiment of a ductwork assembly.

Referring now to FIG. 11, a cross-sectional view of a fourth embodiment of a ductwork assembly is illustrated and is designated 550. As depicted in FIG. 11, the ductwork assembly 550 includes a housing 552. An interior cavity 554 is formed within the housing 552. Also, an inlet end 556 leads to the interior cavity 554 of the housing 552. An outlet end 558 leads from the interior cavity 554 of the housing 552. FIG. 11 further depicts plural serpentine channel dividers 560 that are disposed within the interior cavity 554 of the housing 552. The serpentine channel dividers 560, which in one embodiment have rounded corners (i.e., not sharp, discontinuous corners), establish plural channels 562 that have the same general geometrical characteristics, i.e., the progressive narrowing of the widths of the channels 420, 422, 424, 426, 428, 430, 432, described in conjunction with FIG. 7. Moreover, the serpentine channel dividers 560 promote turbulent flow through the channels 562, which, in turn, increases the heat transfer ability of the heat transfer fluid flowing through the ductwork assembly 550.

In FIGS. 10 and 11, the widths of the channels within each ductwork assembly are not required to be progressively narrower as location of the channel is further from the inlet end and closer to the outlet end. In one embodiment, the channels may have substantially the same width. In another embodiment, the widths of the channels are progressively wider as location of the channel is further from the inlet end and closer to the outlet end.

Figure 12:
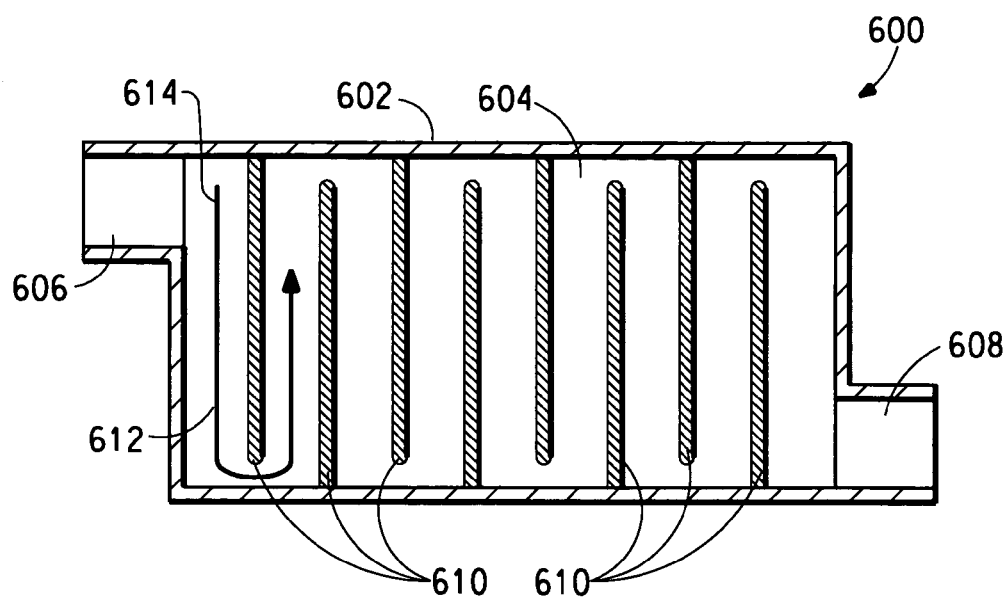
FIG. 12 is a cross-sectional view of a fifth embodiment of a ductwork assembly.

FIG. 12 illustrates a fifth embodiment of a ductwork assembly that is designated 600. As depicted in FIG. 12, the ductwork assembly 600 includes a housing 602. An interior cavity 604 is formed within the housing 602. Also, an inlet end 606 leads to the interior cavity 604 of the housing 602. An outlet end 608 leads from the interior cavity 604 of the housing 602. FIG. 12 further depicts plural channel dividers 610 that are disposed within the interior cavity 604 of the housing 602. As illustrated in FIG. 12, the channel dividers 610 are arranged within the interior cavity 604 of the housing 602 such that a serpentine channel 612 is established within the housing 602 between the inlet end 606 and the outlet end 608. In one embodiment, the serpentine channel 612 is a single, continuous, serpentine channel. In another embodiment, plural serpentine channels may be used. Moreover, a heat transfer fluid can flow through the serpentine channel 612 from the inlet end 606 and to the outlet end 608, as indicated by arrow 614. As the heat transfer fluid flows through the single, continuous, serpentine channel 612, it can dissipate heat within the ductwork assembly 600, e.g., heat transferred to the ductwork assembly 600 from an electronic device thermally coupled thereto, e.g., as shown in FIG. 5.

Figure 13:
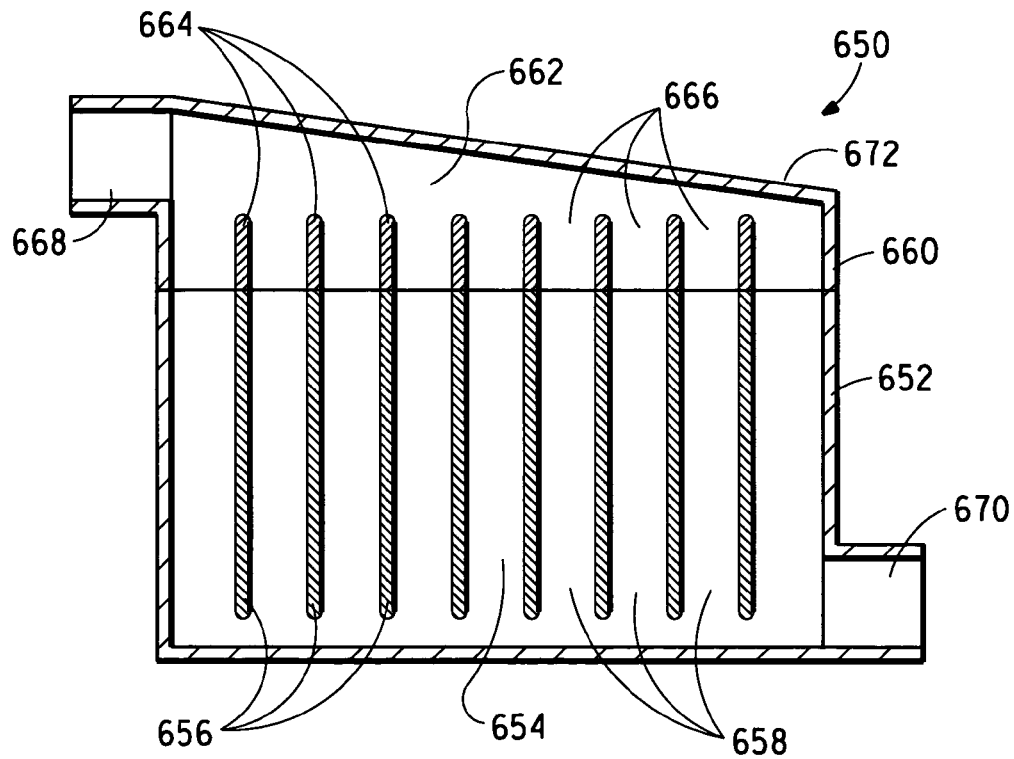
FIG. 13 is a cross-sectional view of a sixth embodiment of a ductwork assembly.

Referring to FIG. 13, a sixth embodiment of a ductwork assembly is illustrated and is generally designated 650. FIG. 13 indicates that the ductwork assembly 650 includes a housing 652. An interior cavity 654 is formed within the housing 652. FIG. 13 further depicts plural channel dividers 656 that are disposed within the interior cavity 654 of the housing 652. The channel dividers 656 are arranged within the interior cavity 654 of the housing 652 so that they establish plural, substantially parallel channels 658. As portrayed in FIG. 13, the channel dividers 656 can be arranged so that each channel 658 has substantially the same width, or in the alternative, the channel dividers 656 can be arranged so that the channels 658 have varying widths, e.g., as shown in FIGS. 7 through 11.

FIG. 13 further illustrates that the ductwork assembly 650 can include a manifold 660 that is fluidly connected to the housing 652. The manifold 660 includes an interior cavity 662 within which plural channel dividers 664 are arranged so that they substantially align with the channel dividers 656 within the housing 652. As such, plural channels 666 are established within the manifold 660 and each channel 666 established within the interior cavity 662 of the manifold 660 aligns with a respective channel 658 established within the interior cavity 654 of the housing 652.

FIG. 13 also illustrates that the manifold 660 includes an inlet end 668. Moreover, the housing 652 includes an outlet end 670. In one embodiment, a heat transfer fluid can flow from the inlet end 668 of the manifold 660, through the channels 666 established within the manifold, through the channels 658 established within the housing 652, and to the outlet end 670 of the housing 652. As is further depicted in FIG. 13, the manifold 660 can include a slanted upper wall 672 that is slanted so that a height of the manifold 660 decreases from the inlet end 668 of the manifold 660 to the last channel established within the manifold 660. As such, the velocity of the heat transfer fluid flowing through the manifold 660 increases as the height of the manifold 660 decreases, i.e., as the distance from the inlet end 668 increases. In another embodiment, the velocity of the heat transfer fluid flowing through the manifold 660 can be maintained to be substantially the same regardless of location within the manifold 660.

In a particular embodiment, the slanted upper wall 672 of the manifold 660 can allow the velocity of the heat transfer fluid to accelerate or remain substantially the same as it travels away from the inlet end 668. This increases the uniformity of the flow of heat transfer fluid through the ductwork assembly 650 and in turn, increases the heat transfer ability of the heat transfer fluid. Further, as the heat transfer fluid flows through ductwork assembly 650, it can dissipate heat within the ductwork assembly 650, e.g., heat transferred to the ductwork assembly 650 from an electronic device thermally coupled thereto, e.g., as shown in FIG. 8. In one embodiment, the manifold 660 can be formed separate from the housing 652 and then, attached thereto, e.g., by one or more fasteners, one or more welds, etc. In another embodiment, the manifold 660 can be integrally formed with the housing 652 without the need for any fasteners, welds, etc.

Figure 14:
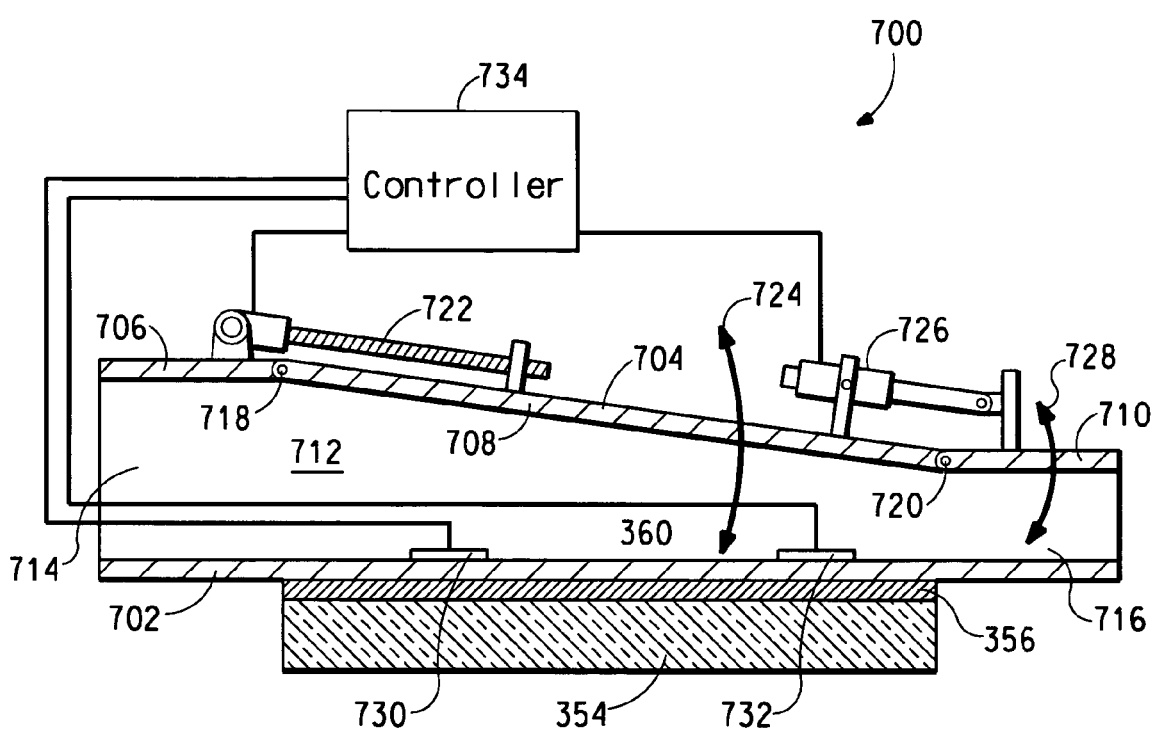
FIG. 14 is a cross-sectional view of a seventh embodiment of a ductwork assembly.

Referring now to FIG. 14, a cross-sectional view of a seventh embodiment of a ductwork assembly, designated 700, is illustrated. By way of explanation, the cross section is taken through one channel of the ductwork assembly 700, and the ductwork assembly 700 can be thermally coupled to a display device 354, e.g., the common electrode 356 of the display device 354. Further, the ductwork assembly includes plural channels substantially identical in cross section to the channel portrayed in FIG. 13. However, the plural channels can have varying widths, similar to those shown in FIG. 7.

As depicted in FIG. 14, the ductwork assembly 700 includes a relatively flat, lower plate 702 that can partially or completely contact a surface of the common electrode 356. Accordingly, the flat, lower plate 702 is thermally coupled to the common electrode 356. FIG. 14 illustrates that the ductwork assembly 700 also includes an upper plate 704. The upper plate 704 includes a first upper plate portion 706 that is substantially parallel to the lower plate 702. A second upper plate portion 708 extends at an angle from the first upper plate portion 706 toward the lower plate 702. Finally, a third upper plate portion 710 extends from the second upper plate portion 708 such that it is parallel to the lower plate 702. Accordingly, the first upper plate portion 706 is located a greater distance from the lower plate 702 than the third upper plate portion 710.

As illustrated in FIG. 14, a channel 712 is established between the lower plate 702 and the upper plate 704. The channel 712 defines an inlet end 714 and an outlet end 716. The inlet end 714 is wider than the outlet end 716. It can be appreciated that as heat transfer fluid travels through the channel 712 from the inlet end 714 to the outlet end 716, the channel 712 restricts the flow of the heat transfer fluid and as such, can accelerate that flow or keep it closer to a substantially constant velocity.

FIG. 14 further depicts that the second upper plate portion 708 can be attached to the first upper plate portion 706 by a first hinge 718. Moreover, the third upper plate portion 710 can be attached to the second upper plate portion 708 via a second hinge 720. A worm screw actuator 722 can be used to move the second upper plate portion 708 relative to the first upper plate portion 706, e.g., by rotating the second upper plate portion 708 around the first hinge 718, as represented by curved arrow 724. Further, a linear actuator 726 can be used to move the third upper plate portion 710 relative to the second upper plate portion 708, e.g., by rotating the third upper plate portion 710 around the second hinge 720, as indicated by the curved arrow 728. In one embodiment, the upper plate 704 can be a substantially rigid, non-moving plate having the general shape illustrated in FIG. 14.

The inclusion of the worm screw actuator 722 and the linear actuator 726 is to illustrate two examples for rotating the second upper plate portion 708 relative to the first upper plate portion 706 and rotating the third upper plate portion 710 relative to the second upper plate portion 708. It can be appreciated that many other devices may be used to accomplish these same tasks.

Still referring to FIG. 14, in a particular embodiment, the ductwork assembly 700 includes a first sensor 730 and a second sensor 732 that are disposed on the surface of the lower plate 702. In an illustrative embodiment, the sensors 730, 732 can be temperature sensors, flow sensors, pressure sensors, etc. In another embodiment, the sensors 730, 732 can be placed on the upper plate 704 so that the sensors 730, 732 are attached to the second upper plate portion 708 and face the lower plate 702. Or, in the alternative, the sensors 730, 732 can be placed on a sidewall within the channel 712. In still another embodiment, more or fewer sensors can be used. FIG. 14 illustrates that the sensors are connected to a controller 734, e.g., via electrical conductors. The controller 734 receives signals, e.g., temperature signals, from the sensors 730, 732. The controller 734 is also connected to the worm screw actuator 722 and the linear actuator 726, e.g., via electrical conductors. Accordingly, during operation of the display device 354 and while the heat transfer fluid is flowing through the ductwork assembly 700, the controller 734 can re-shape the upper plate 704 in order to vary the flow of the heat transfer fluid therethrough. The controller 734 does so based on signals from the sensors 730, 732. For example, if the temperature of the lower plate 702 reaches or exceeds a predetermined threshold or range, the controller 734 can activate the worm screw actuator 722 and the linear actuator 726 in order to move the upper plate 704 away from the lower plate 702 in order to increase the volume of heat transfer fluid flowing across the lower plate 702 and thus, increase the heat exchange between the heat transfer fluid and the lower plate 702.

The change to the upper plate 704 can change the geometry (e.g., the height) of the channel. One or more of the channels may have geometries at or near their outlet ends that are less than geometries near their inlet ends. The position of any one or more of the upper plate portions 706, 708, 710 can be changed while (1) a heat transfer fluid is flowing through the channel 712, (2) the electronic device is operating, or (3) a combination thereof.

In one embodiment, the channels within the ductwork assembly 700 may share the same upper plate portions 706, 708, 710. For this embodiment, the movement of the upper plate portions 708 and 710 affect the fluid flow within all of the channels within the ductwork assembly 700.

In another embodiment, each of the channels may have its own set of upper plate portions 706, 708, 710. Channel dividers (not shown in FIG. 14) may be attached to portions of the upper and lower plates 702 and 704. In one specific embodiment, the set of upper plate portions 706, 708, 710 for each channel can be controlled independently of the other channels. In still another specific embodiment, other control relationships (e.g., master-slave, cascading, etc.) may be used. Therefore, control of the flow through the channels may be dependent or independent of one another.

FIGS. 15 through 18 illustrate that dispersers can be used to help increase the likelihood of turbulent flow, redirect principal directions of fluid flow, more uniformly distribute a flow, otherwise affect at least a portion of the fluid flow, or any combination thereof. In one embodiment, the disperser is a deflector. In another embodiment, the disperser is a flow distributor, such as a baffle plate, an orifice plate, or other structure used to more uniformly distribute the flow of a heat transfer fluid in an overall direction substantially perpendicular to the principal direction of fluid flow upstream from the flow distributor.

Figure 15:
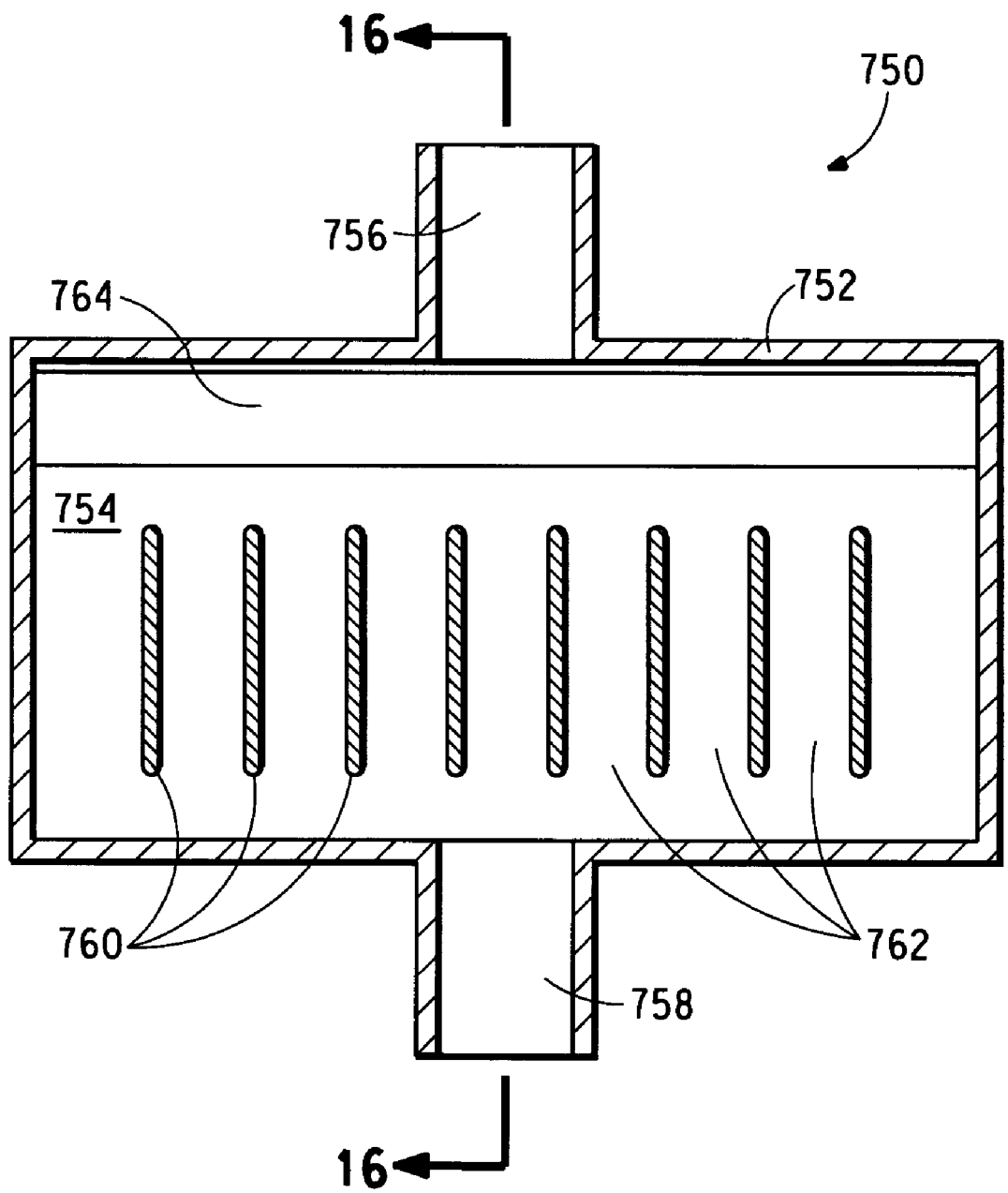
FIG. 15 is a cross-sectional view of an eighth embodiment of a ductwork assembly.
Figure 16:
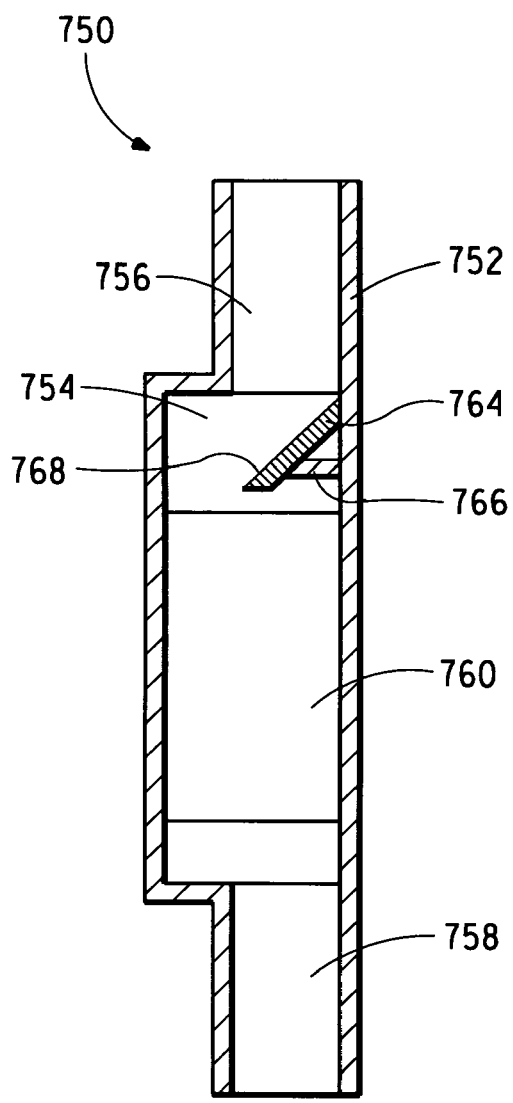
FIG. 16 is a cross-sectional view of the eighth embodiment of a ductwork assembly taken along line 16—16 in FIG. 15.

Referring now to FIGS. 15 and 16, cross-sectional views of an eighth embodiment of a ductwork assembly is illustrated and is designated 750. As depicted in FIG. 15, the ductwork assembly 750 includes a housing 752. An interior cavity 754 is formed within the housing 752. Also, an inlet end 756 leads to the interior cavity 754 of the housing 752. An outlet end 758 leads from the interior cavity 754 of the housing 752. FIG. 15 further depicts plural channel dividers 760 that are disposed within the interior cavity 754 of the housing 752. The channel dividers 760 establish plural channels 762 within the interior cavity 754 of the housing 752.

Figure 17:
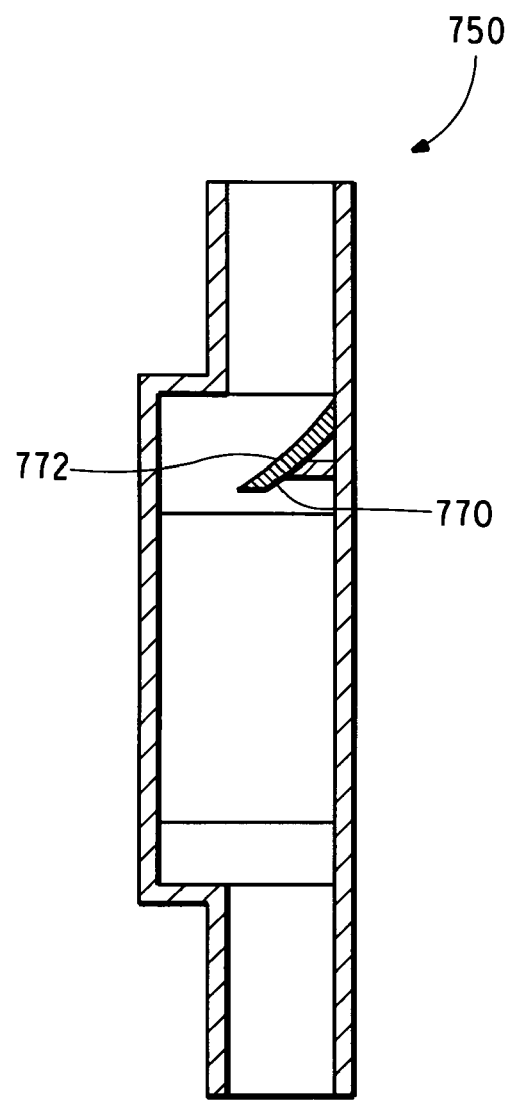
FIG. 17 is a cross-sectional view of the eighth embodiment of a ductwork assembly having an alternative embodiment of a flow disperser.

FIG. 15 illustrates a flat (i.e., substantially planar) flow deflector 764 that is installed within the interior cavity 754 of the housing 752 between the inlet end 756 and the channel dividers 760. As is depicted in FIG. 16, the flow deflector 764 includes a substantially planar deflection side 768. Moreover, the flow deflector 764 can be held in place by plural brackets 766, e.g., two brackets extending from a back wall of the housing 750. In a particular embodiment, the flow deflector 764 can redirect the flow of a heat transfer fluid along a deflection side and relatively evenly disperse the flow of heat transfer fluid to the channels 762. In other words, the flow deflector prevents heat transfer fluid that is flowing into the ductwork assembly 750 via the inlet end 756 from simply flowing straight through the channels 762 centrally located within the housing 752 to the outlet end 758. Accordingly, the flow deflector 764 increases the uniformity of fluid flow through the ductwork assembly 750 and further, increases heat transfer to the heat transfer fluid. The deflector 764 can help to increase the likelihood that turbulent flow will occur. Referring briefly to FIG. 17, it can be seen that the ductwork assembly 750 can include a curved flow deflector 770 that includes a substantially curved deflection side 772. Either example of the flow deflector 764, 770 can be placed anywhere that it is necessary to re-direct the flow of the heat transfer fluid into a ductwork assembly, e.g., into an inlet end of a ductwork assembly, or within a ductwork assembly, e.g., as seen in FIG. 16 and FIG. 17.

Figure 18:
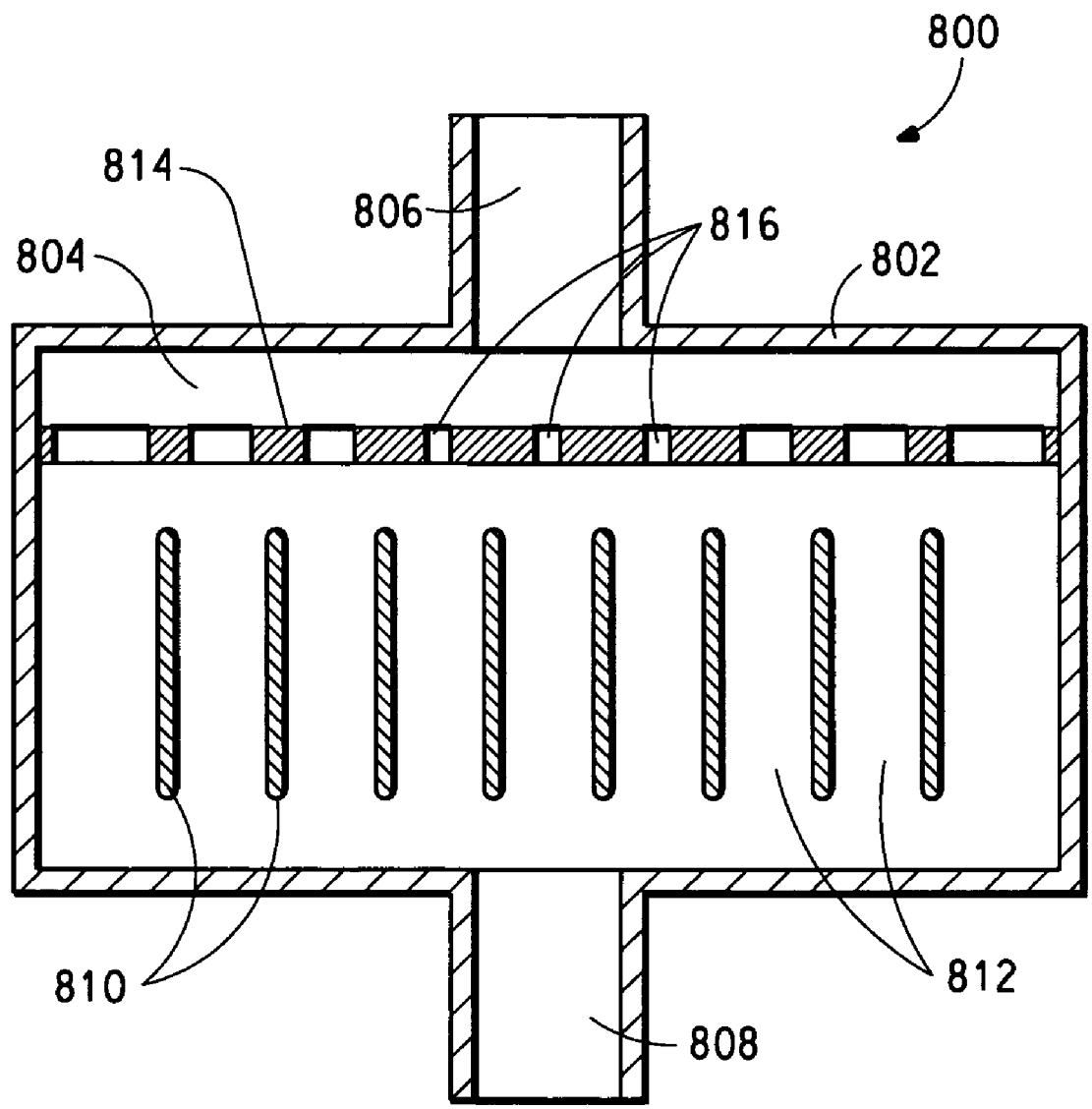
FIG. 18 is a cross-sectional view of a ninth embodiment of a ductwork assembly.

FIG. 18 illustrates a cross-sectional view of a ninth embodiment of a ductwork assembly, designated 800. As depicted in FIG. 18, the ductwork assembly 800 includes a housing 802. An interior cavity 804 is formed within the housing 802. Also, an inlet end 806 leads to the interior cavity 804 of the housing 802. An outlet end 808 leads from the interior cavity 804 of the housing 802. FIG. 18 further depicts plural channel dividers 810 that are disposed within the interior cavity 804 of the housing 802. The channel dividers 810 establish plural channels 812 within the interior cavity 804 of the housing 802.

As further illustrated in FIG. 18, a flow distributor 814 can be installed within the interior cavity 804 of the housing 802 between the inlet end 806 and the channel dividers 810. The flow distributor 814 can be attached to the sidewalls of the housing 802. FIG. 18 portrays that the flow distributor 814 can be formed with plural holes 816 therethrough. The holes 816 extend from the center of the flow distributor 814 and each hole 816 is aligned with a respective channel 812. Moreover, as the distance from the center of the flow distributor 814 increases, the holes 816 get progressively larger. It can be appreciated that the flow distributor 814 relatively evenly distributes the flow of heat transfer fluid to the channels 812 so that heat transfer fluid which flows into the ductwork assembly 800 via the inlet end 806 does not simply flow straight through the channels 812 near the central portion of the housing 802.

As illustrated in FIG. 18, the flow distributor is an orifice plate. In another embodiment, a flow distributor can include a baffle plate located near the inlet end of the ductwork assembly 800. Other shaped structures, such as conical piece(s), may help to distribute the flow more evenly between the channels 812. After reading this specification, skilled artisans will also appreciate that the inlet end and outlet end of each of the ductwork assemblies illustrated in FIG. 7 through FIG. 18 may be oriented in a direction that is different from the direction which is indicated. In other words, the inlet ends and outlet ends may be directed toward the front of the display, the back of the display, or the sides of the display. Moreover, one or more of the ductwork assemblies illustrated in FIG. 7 through FIG. 18 can be arranged to be substantially adjacent to all or a portion of a targeted area in an electronic device. Referring to FIG. 7, the channels, the inlet manifold, the outlet manifold, or any combination thereof may overlie the targeted area. Similar relationships between portion(s) of the other ductwork assemblies and the targeted area may be used. Thus, heat transfer fluid flowing through a ductwork assembly can dissipate heat from the targeted area.

6. Other Embodiments

The temperature control systems may be used with nearly any electronic device that is to be heated, cooled, maintained at a substantially constant temperature or within a desired temperature range, or any combination thereof. Although many of the systems described above involved cooling, heating may be useful in other applications. For example, a liquid crystal ("LCD") display may not operate very well at temperatures below 5° C. However, the LCD display may be in a location where it is exposed to temperatures below freezing. One or more of the temperature control systems may be modified to use a heat transfer fluid that heats the display to allow its use when an ambient temperature is below freezing. In still another embodiment, a temperature control system may be used to maintain a targeted area of the electronic device at substantially constant temperature. Modifications of one or more of the assemblies above may allow for better control.

The temperature control systems as described above can be used for different types of electronic devices and are not limited to displays. The temperature control systems may be used for computers, controllers, thermal sensors, and a wide variety of electronic devices. Organic electronic devices tend to be more sensitive to temperature increases above room temperature compared to inorganic electronic devices. In addition to radiation-emitting electronic components, such as OLEDs, the temperature control systems described herein can be useful for radiation-responsive electronic components, and other electronic components that include an organic active layer. Fan arrangements that are useful for temperature control different types of electronic devices are addressed in U.S. patent application Ser. No. 10/914,813 entitled: "Electronic Device Having A Temperature Control System" by Wang et al. incorporated herein by reference and filed simultaneously herewith.

7. Advantages

Embodiments described herein have benefits compared to conventional devices. For example, as illustrated in FIG. 7, the arrangement of the channel dividers, e.g., the channel dividers 408, 410, 412, 414, 416, 418, to establish channels 422, 424, 426, 428, 430, 432 that get progressively narrower as the distance from the inlet end 404 increases, provides a relatively more uniform flow through the ductwork assembly 358. As such, the heat transfer from the ductwork assembly 358 to the heat transfer fluid therein is increased. Additionally, the channel dividers that are shaped to promote turbulent flow, e.g., the corrugated channel dividers 510 shown in FIG. 10 and the serpentine channel dividers 560 shown in FIG. 11, help increase the heat transfer to the heat transfer fluid flowing through the respective ductwork assemblies 500, 550, as discussed above.

Another benefit is provided by the manifold 660 shown in FIG. 13. Specifically, the slanted plate 672 of the manifold can accelerate the flow of the heat transfer fluid or help to keep it closer to a substantially constant velocity as it travels away from the inlet end 668. This promotes uniform flow of the heat transfer fluid through the ductwork assembly and increases heat transfer between the ductwork assembly and the fluid. The ductwork assembly 700 shown in FIG. 14 further provides a benefit by providing an upper plate 708 that can be reshaped during operation in response to signals from one or more sensors 730, 732 placed adjacent to the lower plate 702. As such, the flow of the heat transfer fluid through the ductwork assembly 700 can be changed to increase the heat transfer between the ductwork assembly 700 and the heat transfer fluid flowing there through.

The two embodiments of ductwork assemblies 750, 800 illustrated in FIG. 15 and FIG. 16 further provide benefits when compared to conventional devices. Each ductwork assembly 750, 800 includes an internal component, e.g., a flow deflector 764 or a flow distributor 814, that can be used to promote uniform flow through each ductwork assembly 750, 800. This also serves to increase heat transfer to the heat transfer fluid that flows through each ductwork assembly 750, 800.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An electronic device comprising:
   an array of organic electronic components comprising an organic active layer; and
   a ductwork assembly adjacent to the array for receiving a heat transfer fluid from a fan, the ductwork assembly comprising:
      a plurality of channel dividers defining channels; and
      a disperser having a center aspect to affect at least a portion of a flow of the heat transfer fluid within the ductwork assembly, wherein the disperser is a flow distributor having a plurality of holes therethrough, said holes being aligned with the channels.

2. The electronic device of claim 1, wherein the holes are progressively larger as the distance from the center of the flow distributor increases.

* * * * *